(12) United States Patent
Li et al.

(10) Patent No.: US 10,605,860 B2
(45) Date of Patent: Mar. 31, 2020

(54) IDENTIFYING LANE ERRORS USING A PSEUDO-RANDOM BINARY SEQUENCE

(71) Applicant: Credo Technology Group Limited, Grand Cayman (KY)

(72) Inventors: Zhongnan Li, Shanghai (CN); Yifei Dai, Shanghai (CN)

(73) Assignee: Credo Technology Group Limited, Grand Cayman (KY)

( * ) Notice: Subject to any disclaimer, the term of this patent is extended or adjusted under 35 U.S.C. 154(b) by 0 days.

(21) Appl. No.: 16/044,065

(22) Filed: Jul. 24, 2018

(65) Prior Publication Data

US 2019/0041455 A1 Feb. 7, 2019

(30) Foreign Application Priority Data

Aug. 7, 2017 (CN) .......................... 2017 1 0666379

(51) Int. Cl.

| G01R 31/317 | (2006.01) |
|---|---|
| G01R 31/3177 | (2006.01) |
| H01L 25/18 | (2006.01) |
| H01L 23/538 | (2006.01) |
| H01L 25/065 | (2006.01) |
| H01L 23/00 | (2006.01) |

(52) U.S. Cl.
CPC ... *G01R 31/31703* (2013.01); *G01R 31/3177* (2013.01); *G01R 31/31717* (2013.01); *H01L 23/5386* (2013.01); *H01L 25/18* (2013.01); *H01L 23/5383* (2013.01); *H01L 24/16* (2013.01); *H01L 25/0655* (2013.01); *H01L 2224/16227* (2013.01); *H01L 2924/1531* (2013.01); *H01L 2924/15192* (2013.01)

(58) Field of Classification Search
CPC .......... G01R 31/31703; G01R 31/3177; H01L 23/5386; H01L 25/18
See application file for complete search history.

(56) References Cited

U.S. PATENT DOCUMENTS

| 7,822,110 B1 * | 10/2010 | Doblar | H04B 3/466 |
| | | | 375/224 |
| 8,832,511 B2 | 9/2014 | Chen et al. | |
| 2003/0063566 A1 * | 4/2003 | Abramovitch | H04L 1/242 |
| | | | 370/241 |
| 2004/0030968 A1 * | 2/2004 | Fan | H04L 1/241 |
| | | | 714/704 |

(Continued)

OTHER PUBLICATIONS

Laskin, E., "A 60 mW per Lane, 4×23-Gb/s 2/sup 7-1 PRBS Generator", IEEE Compound Semiconductor Integrated Circuit Symposium, 2005. CSIC '05, Conference Location: Palm Springs, CA, Date of Conference: Oct. 30-Nov. 2, 2005, pp. 192-195. (Year: 2005).*

(Continued)

*Primary Examiner* — Kyle Vallecillo
(74) *Attorney, Agent, or Firm* — Ramey & Schwaller LLP; Daniel J. Krueger (57) ABSTRACT

A device includes a first die including a pseudo-random binary sequence ("PRBS") generator that outputs test signals on parallel lanes. The device further includes a second die comprising a PRBS checker that compares at least a portion of the test signals with reference signals to identify a particular lane associated with an error.

16 Claims, 5 Drawing Sheets

(56) References Cited

U.S. PATENT DOCUMENTS

| | | | |
|---|---|---|---|
| 2005/0071399 A1* | 3/2005 | Bonaccio | G01R 31/31703 |
| | | | 708/250 |
| 2005/0238123 A1* | 10/2005 | Ranganathan | G01D 5/24 |
| | | | 375/343 |
| 2005/0243893 A1* | 11/2005 | Ranganathan | G01D 5/24 |
| | | | 375/130 |
| 2009/0074407 A1* | 3/2009 | Hornbuckle | H04B 10/532 |
| | | | 398/43 |
| 2010/0246699 A1* | 9/2010 | Moriizumi | H04L 1/0061 |
| | | | 375/260 |
| 2012/0264320 A1* | 10/2012 | Parrish | G01R 1/07378 |
| | | | 439/249 |
| 2014/0241727 A1* | 8/2014 | Lim | H04J 14/0298 |
| | | | 398/76 |

OTHER PUBLICATIONS

Laskin, Ekaterina. On-Chip Self-Test Circuit Blocks for High-Speed Applications. 2006. University of Toronto, Masters Thesis.

* cited by examiner

IDENTIFYING LANE ERRORS USING A PSEUDO-RANDOM BINARY SEQUENCE

BACKGROUND

Integrated circuits ("ICs") are incorporated into many electronic devices. IC packaging has evolved such that multiple ICs may be vertically joined together in so-called three-dimensional ("3D") packages in order to save horizontal area on a printed circuit board ("PCB"). Another packaging method, referred to as 2.5D IC packaging, incorporates an interposer, which may be formed from a semiconductor material such as silicon, for coupling one or more dies to a PCB. However, memory and logic testing of 2.5D ICs can be costly and inefficient, involving a large area on the IC chip as well as external equipment to generate the testing signals. Additionally, such tests may only locate general problem areas rather than specific locations of errors.

SUMMARY

Accordingly, to identify specific lane errors, systems, methods, and devices for using a pseudo-random binary sequence ("PRBS") are disclosed herein. An illustrative device includes a first die including a pseudo-random binary sequence ("PRBS") generator that outputs test signals on parallel lanes. The device further includes a second die comprising a PRBS checker that compares at least a portion of the test signals with reference signals to identify a particular lane associated with an error.

A method includes generating test signals comprising at least a portion of a PRBS. The method further includes transmitting the test signals on parallel lanes. The method further includes comparing at least a portion of the test signals with reference signals. The method further includes identifying a particular lane associated with an error based on the comparison.

A 2.5-dimensional integrated circuit includes a first die including a PRBS generator that outputs test signals on parallel lanes. The integrated circuit further includes a second die including a PRBS checker that compares at least a portion of the test signals with reference signals to identify a particular lane associated with an error. The integrated circuit further includes an interposer, that couples to a printed circuit board, coupled to the first and second dies, the interposer comprising the parallel lanes.

BRIEF DESCRIPTION OF THE DRAWINGS

In the following detailed description of the various disclosed embodiments, reference will be made to the accompanying drawings in which.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

NOTATION AND NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

DETAILED DESCRIPTION

Improved built-in self-test ("BIST") circuits, devices, and methods are disclosed that advantageously enable reduced testing time and greater testing accuracy by identifying a particular lane causing an error rather than a set of lanes. Additionally, the BIST circuits, devices, and methods reduce the amount of area overhead required for the testing circuitry as well as reduce the speed degradation experienced by conventional 2.5D integrated circuit ("IC") test circuits.

Figure 1:
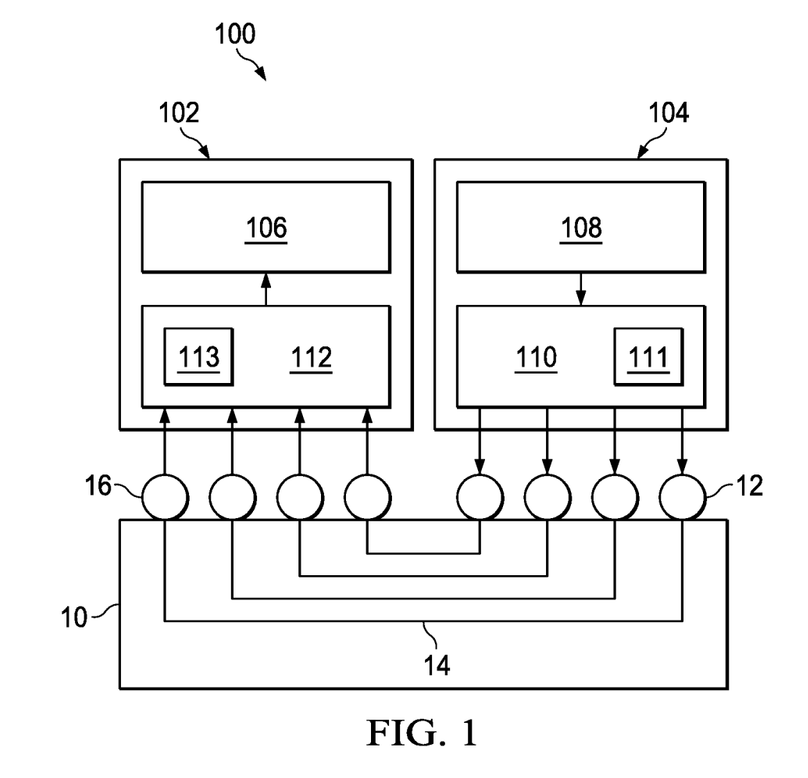
FIG. 1 is a block diagram of a pair of dies configured with built-in self-test circuitry for testing.

FIG. 1 is a block diagram of a device 100 that uses such BIST circuits to identify particular lanes containing errors using a PRBS. The device 100 includes a semiconductor interposer 10 (e.g., a silicon interposer) coupled to a first die 102 and a second die 104. In a multi-chip module configuration, the interposer 10 serves as the interface to a PCB. Each of the first and second dies 102, 104 include internal logic circuitry 106, 108 configured to perform a wide variety of functions. Each die 102, 104 also includes BIST circuitry 110, 112. Such BIST circuitry 110, 112 is configured to both generate and receive test signals, making the dies 102, 104 identical, but for clarity in the examples used herein, die 104 will be used to test the communications lanes between it and die 102. Specifically, BIST circuitry 110 ("launch circuitry") is configured to generate test signals, which are transmitted to the interposer 10 via conductive bumps 12, and BIST circuitry 112 ("capture circuitry") is configured to receive signals from the conductive bumps 16 in response. The interposer 10 includes conductive interconnections 14 (e.g., traces and vias), that provide multiple communications lanes for routing signals sent and received by dies 102, 104 between bumps 12 and 16.

Figure 2A:
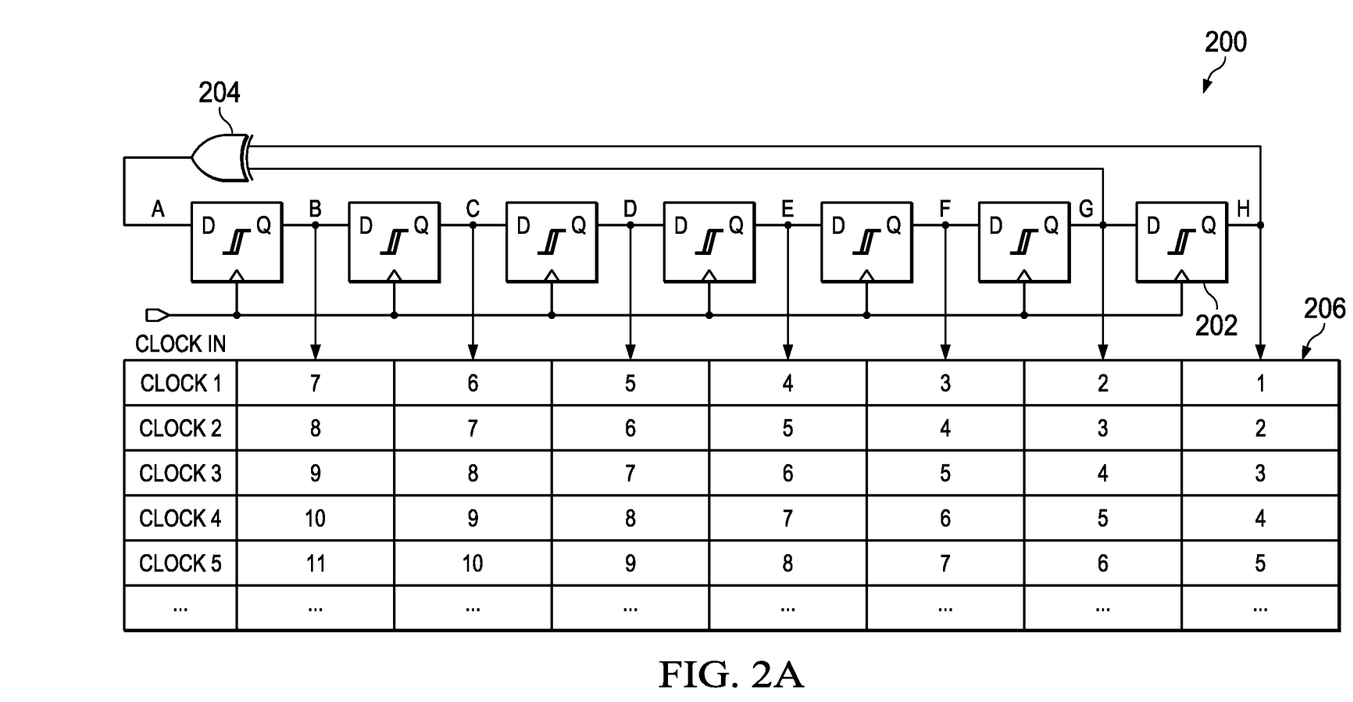
FIG. 2A is a circuit diagram of a series PRBS generator along with its output sequences.
Figure 2B:
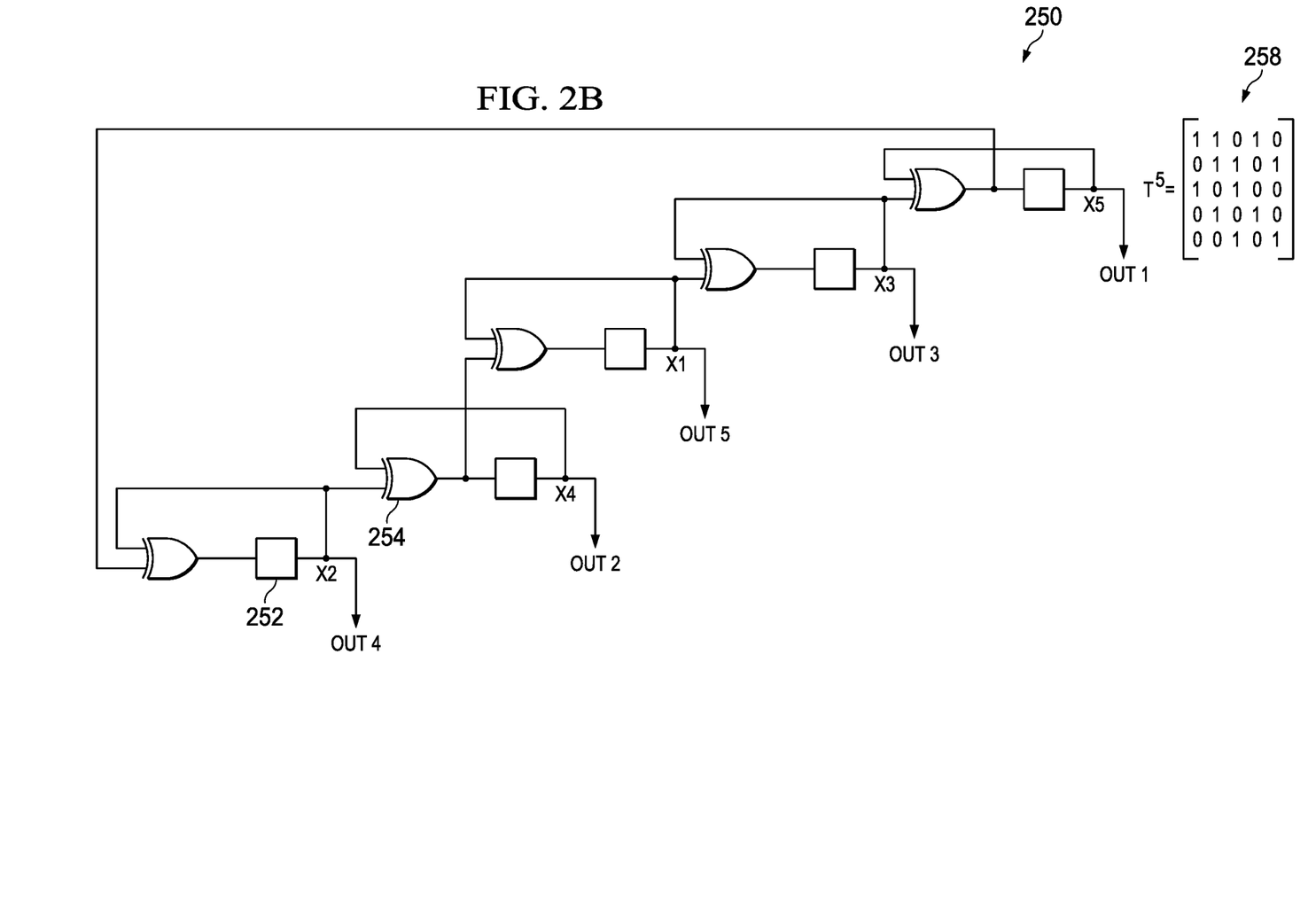
FIG. 2B is a circuit diagram of a parallel PRBS generator along with its transition matrix.

The launch circuitry 110 includes a pseudo-random binary sequence ("PRBS") generator 111, and the capture circuitry 112 includes a PRBS checker 113. A PRBS is a binary sequence that, while generated with a deterministic algorithm, exhibits statistical behavior similar to a truly random sequence such as noise. As such, a PRBS is robust enough to be used for testing purposes, but deterministic such that a PRBS generated by the generator 111 may be recreated by the checker 113 given the same initial conditions. Specifically, a PRBS is generated by the PRBS generator 111, transmitted through the lanes 14, and received by the capture circuitry 112. A second PRBS is created by the PRBS checker 113, which uses the same initial conditions as the PRBS generator 111. If the PRBS received by the capture circuitry 112 matches the PRBS created by the PRBS checker 113, then the lanes are free from error. If the PRBS received by the capture circuitry 112 does not match the PRBS created by the PRBS checker 113, then each particular lane causing the mismatch is identified as discussed below. FIGS. 2A and 2B illustrate a series and parallel PRBS generator respectively.

FIG. 2A illustrates a series PRBS generator 200, which functions as a shift register with a linear feedback function that causes the shift register to output a PRBS of a certain length before repeating, along with an output table 206. The generator 200 includes flip flops 202, used as memory elements of the shift register, and an XOR gate 204 used as an adder to implement the feedback. Although the feedback function is illustrated as a XOR gate 204, in other embodiments one or more other logic gates are used, e.g., AND gates, NOR gates, OR, gates, NAND gates, and the like.

As illustrated, the generator 200 generates a PRBS 127 bits long before repeating, but in various embodiments a PRBS of any suitable length may be generated by adjusting the shift register length and feedback function. As shown in the output table 206, during the first clock cycle, the flip flops 202 produce bits 1, 2, 3, 4, 5, 6, and 7 of the 127-bit PRBS. During the second clock cycle the flip flops 202 produce bits 2, 3, 4, 5, 6, 7, and 8, and so on.

Other PRBS generator implementations can be found in the open literature and would also be suitable. For example, FIG. 2B illustrates a parallel PRBS generator 250, using flip flops 252 as memory elements and XOR gates 254 as adders. FIG. 2B also shows the corresponding transition matrix 258. In other parallel generator embodiments, other logic gates are used, e.g., AND gates, NOR gates, OR, gates, NAND gates, and the like. Parallel PRBS generators can produce several shifted sequences in parallel, and it is convenient to represent the circuit using a transition matrix T 258 that represents how data is transferred between the memory elements of the generator 250. If U(j) is an n×1 vector of binary bits that represents the state (what is stored in each memory element) of an n-stage PRBS generator at the jth clock cycle, then T 258 is an n×n matrix that can be used to find the state of the generator at the next clock cycle. The columns of T 258 correspond to the data stored in the stages of the PRBS generator 250. The rows of T 258 correspond to the connections that exist between stages. For clarity, a small number of rows, columns, gates, and flip flops have been shown. In practice, it is expected more than five memory elements would be employed. The PRBS generator 250 includes an appropriate number of elements to generate a robust PRBS for use in a testing system such as that of FIG. 3.

Figure 3:
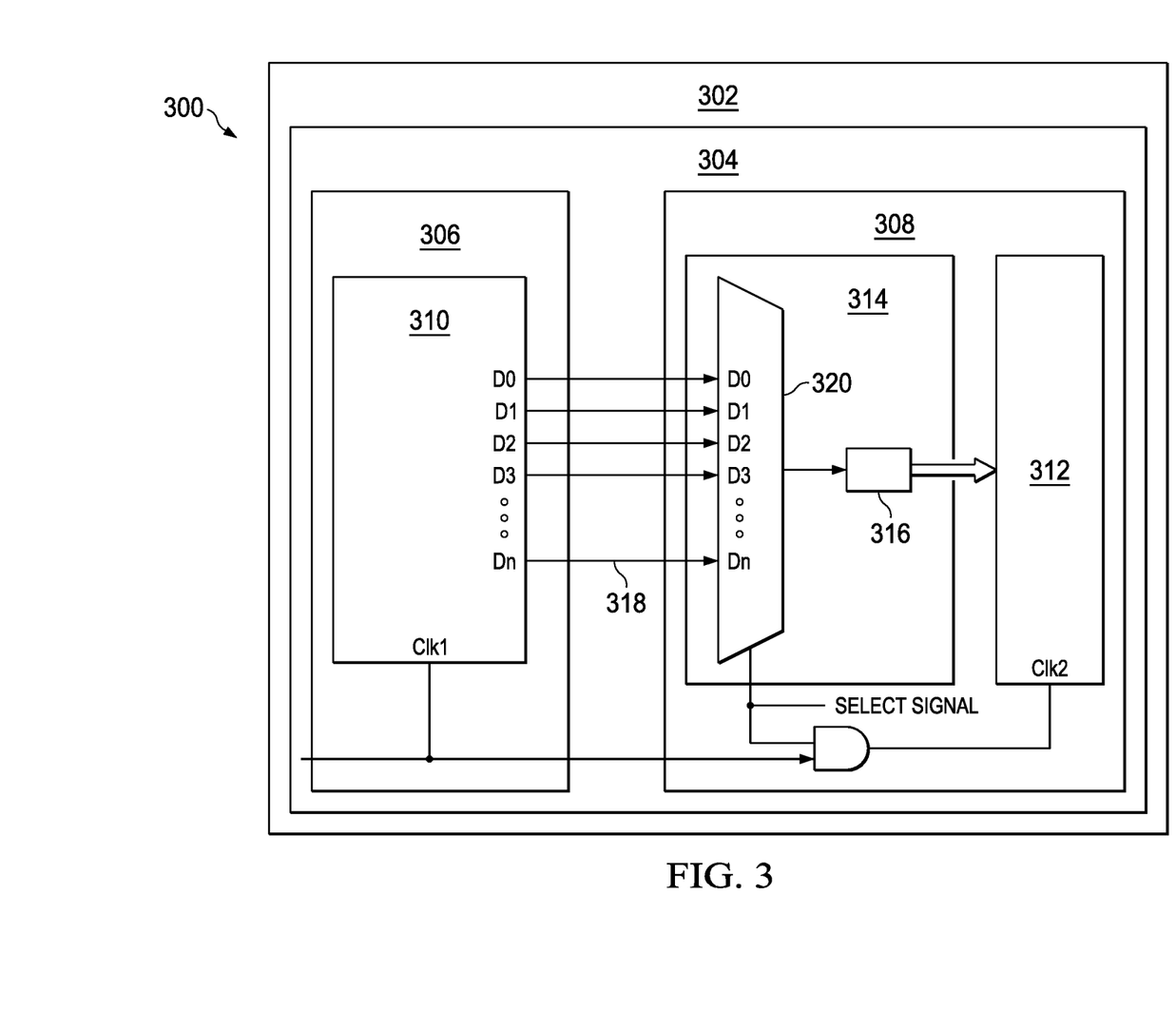
FIG. 3 is a block diagram of a device including a PRBS generator and PRBS checker.

FIG. 3 is a block diagram of a system 300 for identifying particular interconnections or lanes containing errors using a PRBS. The system 300 includes a first die 306 including a PRBS generator 310, as described above, that outputs test signals on parallel lanes 318. The system 300 also includes a second die 308 including a PRBS checker 312 that compares at least a portion of the test signals with reference signals to identify a particular lane 318 associated with an error. The reference signals may include a PRBS created by the PRBS checker 312 separately from the PRBS generator 310. The first die 306 and second die 308 are coupled to an interposer 304, which is coupled to a PCB 302. The interposer 304 includes conductive interconnections 318 (e.g., traces and vias), that provide communications lanes for routing signals sent and received by the dies 102, 104.

The test signals include n bits of a PRBS generated by the PRBS generator 310 and transmitted in parallel, one bit per lane 318, where n is a power of two. When n is a power of two, the PRBS may be decimated such that the parallel structure of transmission results in the same PRBS appearing on each lane 318 except phase-shifted relative to the other lanes 318. Thus, the test signal is effectively decimated by selecting one interconnection at a time. Specifically, decimation is defined as forming a sequence $\{a_{nk}\}$ from the PRBS $\{a_k\}$ by taking every nth bit of $\{a_k\}$ where n is a positive integer. Decimation of any PRBS forms another PRBS. However, when n is a power of 2, decimation by n does not change the order of bits in the PRBS as proven by Laskin, E. (2006), *On-Chip Self-Test Circuit Blocks for High-Speed Applications* (Thesis), retrieved from http://www.eecg.toronto.edu/~sorinv/theses/laskin_MASc_thesis.pdf, which is hereby incorporated by reference. That is, if $\{a_k\}$ is a PRBS then $\{a_{nk}\}$ differs from $\{a_k\}$ by at most a phase shift, for n=1, 2, 4, 8, . . . . A decimator 314 forms such $\{a_{nk}\}$ sequences from each lane. Specifically, the second die 308 includes a decimator 314 that forms a word for each lane 318. Each word is formed by selecting every nth bit of the PRBS generated by the PRBS generator 310 as one bit of the word. As such, the first-selected bit of each word is determined based on the lane 318 to be checked, and subsequent bits are selected because they are n bits away from the previously selected bit for that lane. For example, the decimator 314 forms a word using lane D0; the first bit of the word is the first bit of the PRBS, the second bit of the word is the n+1th bit of the PRBS, the third bit of the word is the 2n+1th bit of the PRBS, and so on. The decimator also forms a word using the lane D1; the first bit of the word is the second bit of the PRBS, the second bit of the word is the n+2th bit of the PRBS, the third bit of the word is the 2n+2th bit of the PRBS, and so on. In this way, a word is formed using each lane, and each of the words are phase-shifts of the PRBS generated by the PRBS generator 310. In at least one embodiment, the word for each lane is also n bits long. In another embodiment, the word for each lane is as long as the PRBS generated by the PRBS generator 310. In some contemplated embodiments, the word length is equal to the number of memory elements in the PRBS generator to facilitate bit-wise comparison of the word to the PRBS generator state. In various embodiments, the word length is customizable to be as long or as short as necessary for error identification.

The decimator 314 includes a multiplexer 320, coupled to the parallel lanes 318, that forms such words and outputs bits sequentially received on any one selected lane 318. The decimator 314 also includes a serial-to-parallel converter 316, coupled to the multiplexer 320 and the PRBS checker 312, that receives serial bits from the multiplexer 320 and outputs the bits in parallel to the PRBS checker 312. Specifically, a lane select signal enables the multiplexer 320 to send a particular word from one lane 318 to the converter 316. After parallelization by the converter 316, the word is checked against a PRBS created by the PRBS checker. If the word matches all or a portion of the PRBS in various embodiments, then the lane is free from error. If the word does not match all or a portion of the PRBS in various embodiments, then the particular lane is identified as having an error. Similarly, each lane may be checked for errors. In this way, the location of the error is identified specifically with regards to a particular lane rather than generally with regards to a set of lanes. The same PRBS generated by the PRBS checker 312 may be used to check each lane 318 for errors because each lane provides all or part the same PRBS, only phase-shifted relative to other lanes.

Figure 4:
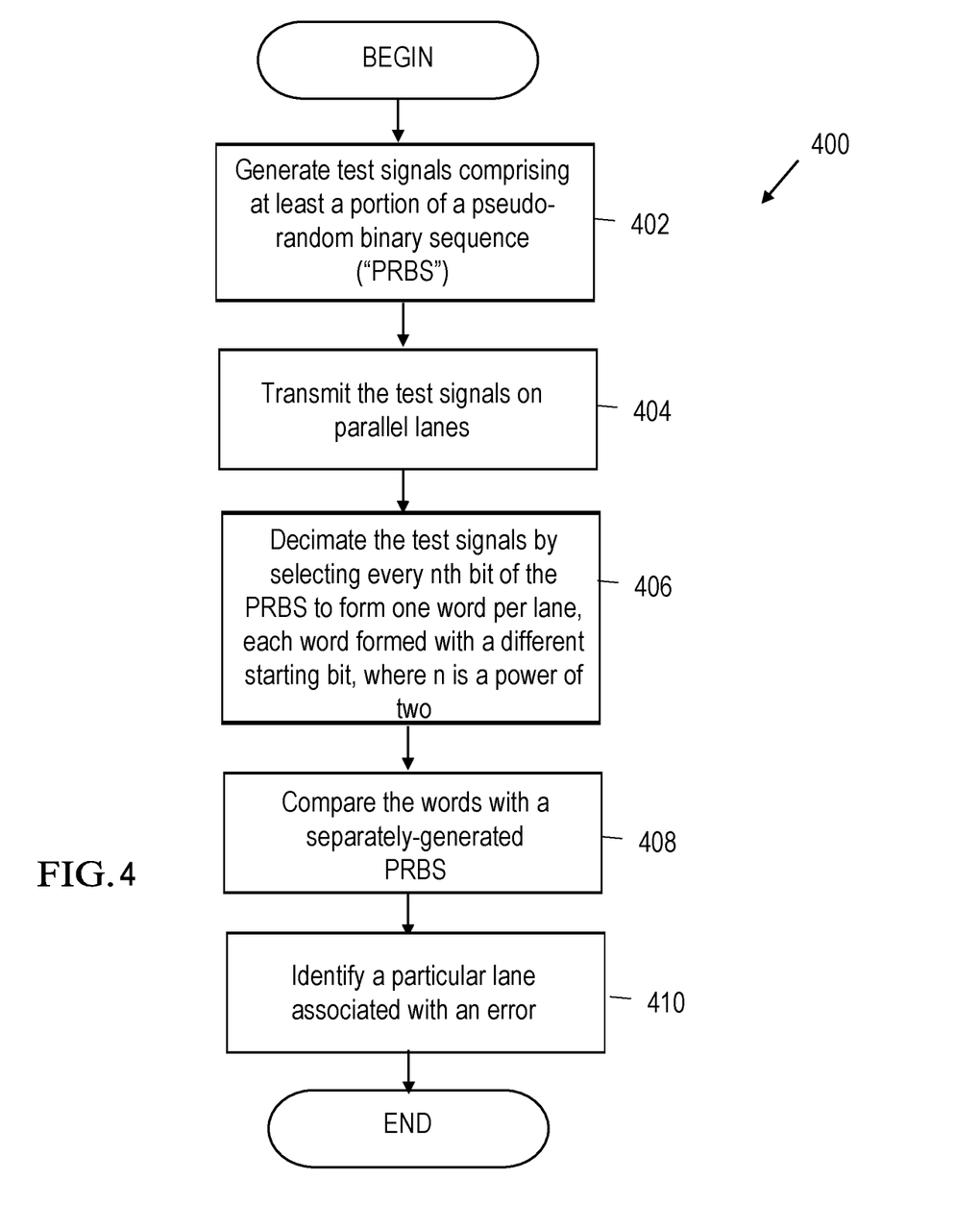
FIG. 4 is a flow diagram of a method of identifying lane errors using a PRBS.

FIG. 4 illustrates a method 400 of identifying a particular lane associated with an error using a PRBS. At 402, a PRBS generator generates test signals including a PRBS or a portion of a PRBS. At 404, launch circuitry transmits the test signals on parallel lanes such as those located on an interposer. At 406, capture circuitry decimates the test signals. For example, the capture circuitry may form an n-bit word from the PRBS for each lane, the first-selected bit of the n-bit word determined based on the lane to be checked, where n is a power of two.

At 408, capture circuitry compares at least a portion of the test signals, e.g. one or more words formed from the one or more lanes, with reference signals created by a PRBS checker, e.g. the PRBS created separately from, but from the same initial conditions as, the PRBS generated by the PRBS generator. Based on a mismatch between the one or more words and a portion or all of the separately-created PRBS, at 410, the capture circuitry identifies a particular lane or lanes associated with an error. Such identification of a particular lane is a cheaper and more efficient method of testing than locating general problem areas.

In some aspects systems, devices, and methods for identifying lane errors are provided according to one or more of the following examples:

EXAMPLE 1

A device includes a first die including a PRBS generator that outputs test signals on parallel lanes. The device further includes a second die comprising a PRBS checker that compares at least a portion of the test signals with reference signals to identify a particular lane associated with an error.

EXAMPLE 2

A method includes generating test signals comprising at least a portion of a PRBS. The method further includes transmitting the test signals on parallel lanes. The method further includes comparing at least a portion of the test signals with reference signals. The method further includes identifying a particular lane associated with an error based on the comparison.

EXAMPLE 3

A 2.5-dimensional integrated circuit includes a first die including a PRBS generator that outputs test signals on parallel lanes. The integrated circuit further includes a second die including a PRBS checker that compares at least a portion of the test signals with reference signals to identify a particular lane associated with an error. The integrated circuit further includes an interposer, that couples to a printed circuit board, coupled to the first and second dies, the interposer comprising the parallel lanes.

The following features may be incorporated into the various embodiments described above, such features incorporated either individually in or conjunction with one or more of the other features. The test signals may include n bits of a PRBS generated by the PRBS generator and output in parallel, one bit per lane, where n is a power of two. The second die may include a decimator that outputs an n-bit word to the PRBS checker, the n-bit word formed by selecting every nth bit of a PRBS generated by the PRBS generator as one bit of the n-bit word, the first-selected bit of the n-bit word determined based on the lane to be checked, where n is a power of two. The second die may include a decimator comprising a multiplexer, coupled to the parallel lanes, that outputs n bits sequentially received on any one selected lane, where n is a power of two. The decimator may include a serial-to-parallel converter, coupled to the multiplexer and the PRBS checker, that receives n serial bits from the multiplexer and output the n bits in parallel to the PRBS checker. The reference signals may include a PRBS generated by the PRBS checker separately from the PRBS generator. The same PRBS generated by the PRBS checker may be used to check each lane for errors. The device may include an interposer coupled to the first and second dies, the interposer comprising the parallel lanes. The method may include decimating the test signals. Decimating the test signals may include forming an n-bit word as one bit of the n-bit word, the first-selected bit of the n-bit word determined based on the lane to be checked, where n is a power of two. Comparing the test signals with the reference signals may include comparing the n-bit word with a PRBS generated separately from the test signals. The reference signals may include a PRBS generated separately from the test signals. Comparing the test signals with the reference signals may include comparing the separately-generated PRBS with one n-bit word per lane.

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A device comprising:
a first die comprising a pseudo-random binary sequence ("PRBS") generator that outputs test signals on parallel lanes, the test signals comprising n bits of a PRBS generated by the PRBS generator and output in parallel, one bit per lane, where n is a power of two; and
a second die comprising a PRBS checker that compares at least a portion of the test signals with reference signals to identify a particular lane associated with an error.

2. A device comprising:
a first die comprising a pseudo-random binary sequence ("PRBS") generator that outputs test signals on parallel lanes; and
a second die comprising:
a PRBS checker that compares at least a portion of the test signals with reference signals to identify a particular lane associated with an error; and
a decimator that outputs an n-bit word to the PRBS checker, the n-bit word formed by selecting every nth bit of a PRBS generated by the PRBS generator as one bit of the n-bit word, a first-selected bit of the n-bit word determined based on a lane to be checked, where n is a power of two.

3. The device of claim 1, wherein the second die comprises a decimator comprising a multiplexer, coupled to the parallel lanes, that outputs n bits sequentially received on any one selected lane.

4. The device of claim 3, wherein the decimator comprises a serial-to-parallel converter, coupled to the multiplexer and the PRBS checker, that receives n serial bits from the multiplexer and output the n bits in parallel to the PRBS checker.

5. The device of claim 1, wherein the reference signals comprise a PRBS generated by the PRBS checker separately from the PRBS generator.

6. The device of claim 5, wherein the same PRBS generated by the PRBS checker is used to check each lane for errors.

7. A method comprising:
generating test signals comprising at least a portion of a pseudo-random binary sequence ("PRBS");
transmitting the test signals on parallel lanes, the test signals comprising n bits of the PRBS being transmitted in parallel, one bit per lane, where n is a power of two;
comparing at least a portion of the test signals with reference signals; and
identifying a particular lane associated with an error based on the comparison.

8. A method comprising:
generating test signals comprising at least a portion of a pseudo-random binary sequence ("PRBS");
transmitting the test signals on parallel lanes;
decimating the test signals to obtain a decimated portion of the test signals;
comparing the decimated portion of the test signals with reference signals; and
identifying a particular lane associated with an error based on the comparison.

9. The method of claim 8, wherein decimating the test signals comprises forming an n-bit word as one bit of the n-bit word, a first-selected bit of the n-bit word determined based on a lane to be checked, where n is a power of two.

10. The method of claim 9, wherein comparing the test signals with the reference signals comprises comparing the n-bit word with a PRBS generated separately from the test signals.

11. The method of claim 7, wherein the reference signals comprise a PRBS generated separately from the test signals.

12. The method of claim 11, wherein comparing the test signals with the reference signals comprises comparing the separately-generated PRBS with one n-bit word per lane.

13. A 2.5-dimensional integrated circuit comprising:
a first die comprising a pseudo-random binary sequence ("PRBS") generator that outputs test signals on parallel lanes, the test signals comprising n bits of a PRBS generated by the PRBS generator and output in parallel, one bit per lane, where n is a power of two;
a second die comprising a PRBS checker that compares at least a portion of the test signals with reference signals to identify a particular lane associated with an error; and
an interposer, that couples to a printed circuit board, coupled to the first and second dies, the interposer comprising the parallel lanes.

14. The integrated circuit of claim 13, wherein the second die comprises a decimator that outputs an n-bit word to the PRBS checker, the n-bit word formed by selecting every nth bit of a PRBS generated by the PRBS generator as one bit of the n-bit word, a first-selected bit of the n-bit word determined based on a lane to be checked.

15. The integrated circuit of claim 13, wherein the second die comprises a decimator comprising a multiplexer, coupled to the parallel lanes, that outputs n bits sequentially received on any one selected lane.

16. The integrated circuit of claim 15, wherein the decimator comprises a serial-to-parallel converter, coupled to the multiplexer and the PRBS checker, that receives n serial bits from the multiplexer and output the n bits in parallel to the PRBS checker.

* * * * *